(12) United States Patent
Lemmons

(10) Patent No.: US 11,357,351 B2
(45) Date of Patent: Jun. 14, 2022

(54) TREE STAND DISPLAY ASSEMBLY

(71) Applicant: Rebecca Lynn Lemmons, Fridley, MN (US)

(72) Inventor: Rebecca Lynn Lemmons, Fridley, MN (US)

(*) Notice: Subject to any disclaimer, the term of this patent is extended or adjusted under 35 U.S.C. 154(b) by 148 days.

(21) Appl. No.: 16/690,819

(22) Filed: Nov. 21, 2019

(65) Prior Publication Data

US 2021/0153680 A1    May 27, 2021

(51) Int. Cl.

| | | |
|---|---|---|
| A47G 33/12 | (2006.01) | |
| F21V 23/06 | (2006.01) | |
| H05K 5/00 | (2006.01) | |
| H05K 5/02 | (2006.01) | |
| F21V 31/00 | (2006.01) | |
| G06F 3/14 | (2006.01) | |
| A47G 33/08 | (2006.01) | |
| F21W 121/04 | (2006.01) | |
| F21Y 115/10 | (2016.01) | |
| F21V 23/00 | (2015.01) | |

(52) U.S. Cl.
CPC ......... *A47G 33/12* (2013.01); *A47G 33/0818* (2013.01); *F21V 23/06* (2013.01); *F21V 31/005* (2013.01); *G06F 3/1423* (2013.01); *H05K 5/0017* (2013.01); *H05K 5/0021* (2013.01); *H05K 5/0221* (2013.01); *H05K 5/0247* (2013.01); *A47G 2033/0827* (2013.01); *A47G 2033/122* (2013.01); *A47G 2033/1286* (2013.01); *F21V 23/003* (2013.01); *F21W 2121/04* (2013.01); *F21Y 2115/10* (2016.08)

(58) Field of Classification Search
CPC .......................... A47G 33/12; F21W 2121/04
See application file for complete search history.

(56) References Cited

U.S. PATENT DOCUMENTS

| | | |
|---|---|---|
| 2,190,544 A | 2/1940 | Jarnagin |
| 2,874,496 A | 2/1959 | Rakes |
| 2,956,357 A | 10/1960 | Rakes |
| 3,147,175 A | 9/1964 | Gonzalez |
| 3,415,513 A | 12/1968 | Burnbaum |
| 3,905,140 A | 9/1975 | Damiano |
| 4,076,234 A | 2/1978 | Bumbaum |
| 4,985,699 A * | 1/1991 | Evans .................... A47G 33/12 340/4.37 |
| 5,211,366 A | 5/1993 | Cummings |
| 5,279,871 A | 1/1994 | Segan et al. |
| D354,021 S | 1/1995 | Kielbasa |

(Continued)

OTHER PUBLICATIONS

Webpage, https://www.youtube.com/watch?v=-IkKAG39r6Q, "LED round screen P3.91," May 25, 2016, retrieved from the internet Mar. 29, 2020, 2 pgs.

(Continued)

*Primary Examiner* — Evan P Dzierzynski

(74) *Attorney, Agent, or Firm* — Fredrikson & Byron, P.A.

(57) ABSTRACT

The invention provides an annular shroud configured to be positioned around a tree stand. The annular shroud has one or more display panels configured to display digital images about a perimeter of the tree stand. In some embodiments, the invention further includes a tree stand display assembly comprising a tree, a tree stand supporting the tree in an upright orientation, and the annular shroud around the tree stand.

20 Claims, 3 Drawing Sheets

(56) References Cited

U.S. PATENT DOCUMENTS

| | | | |
|---|---|---|---|
| 5,450,682 A | 9/1995 | Franco et al. | |
| 5,911,633 A | 6/1999 | Sofy et al. | |
| 5,969,620 A * | 10/1999 | Okulov | A01G 27/008 |
| | | | 340/618 |
| 6,041,545 A | 3/2000 | Sofy et al. | |
| 6,152,800 A | 11/2000 | Higuchi | |
| 7,581,849 B2 | 9/2009 | Mock | |
| 9,398,670 B2 | 7/2016 | Kidakarn | |
| 9,655,218 B1 | 5/2017 | DePhillips | |
| 9,796,094 B1 | 10/2017 | DePhillips | |
| 9,991,654 B1 | 6/2018 | DePhillips | |
| 10,683,974 B1 * | 6/2020 | Chen | F21V 23/06 |
| 2006/0112622 A1 * | 6/2006 | Solak | A47G 33/12 |
| | | | 47/40.5 |
| 2008/0160224 A1 | 7/2008 | Nakamura | |
| 2009/0121114 A1 * | 5/2009 | Odom, Jr. | A47G 33/12 |
| | | | 248/525 |
| 2011/0141740 A1 * | 6/2011 | Scollan | A47G 33/12 |
| | | | 362/249.18 |
| 2014/0120361 A1 * | 5/2014 | Junkin | A47G 33/12 |
| | | | 428/596 |
| 2015/0292728 A1 * | 10/2015 | Gary | A47G 33/06 |
| | | | 362/123 |
| 2015/0301588 A1 * | 10/2015 | Jeong | G06F 1/3203 |
| | | | 713/323 |
| 2016/0097520 A1 * | 4/2016 | Dunnihoo | F21V 21/30 |
| | | | 362/249.06 |
| 2016/0203841 A1 | 7/2016 | Cho et al. | |

OTHER PUBLICATIONS

Webpage, https://www.youtube.com/watch?v=qlRjytgNuhM, "LG's Future Display Technology will Blow You Away," May 2, 2017, retrieved from the internet Mar. 29, 2020, 3 pgs.

Webpage, https://pixelwix.com/home/29-360-degree-projection-screens.html, "360 degree projection screens," retrieved from the internet Mar. 29, 2020, believed to have been publicly available prior to the filing date of the instant application, 10 pgs.

Webpage, https://inmyownstyle.com/metal-christmas-tree-skirt.html, "Modern + Minimalist Christmas Tree Skirt," Nov. 30, 2012, retrieved from the internet Mar. 29, 2020, 19 pgs.

Webpage, https://pixelflexled.com/products/flextour/, "FLEXTour Product Overview," retrieved from the internet May 4, 2020, believed to have been publicly available prior to the filing date of the instant application, 7 pgs.

* cited by examiner

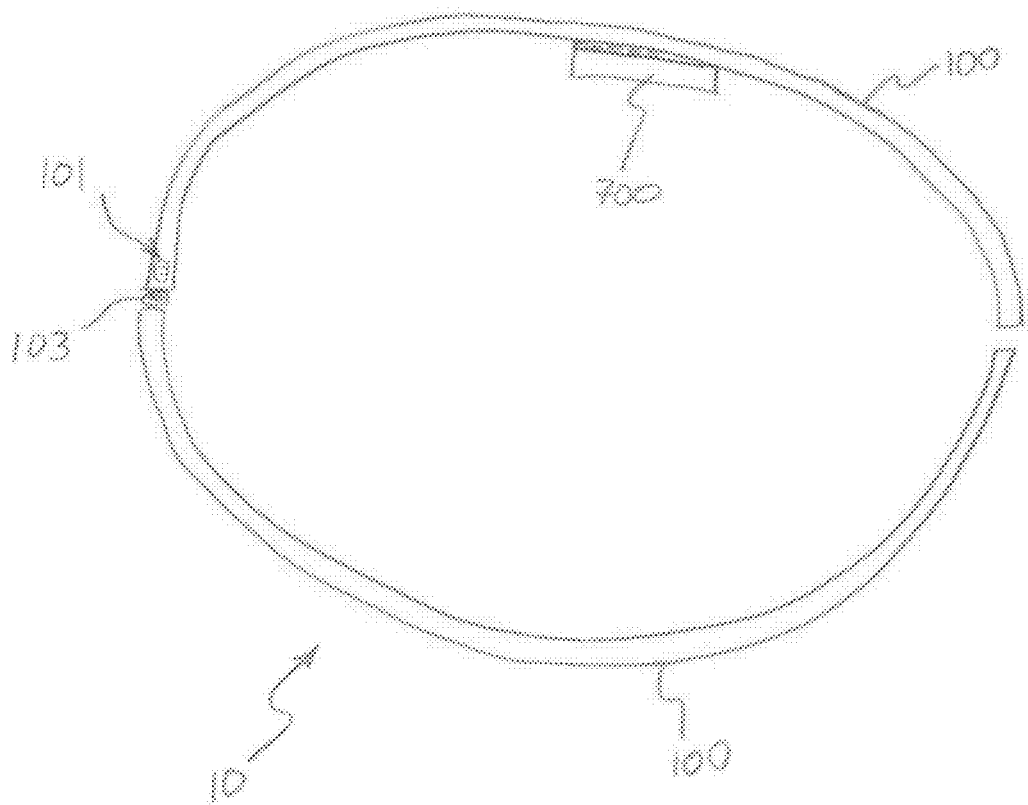

TREE STAND DISPLAY ASSEMBLY

FIELD OF THE INVENTION

The present invention relates generally to display assemblies, and more particularly to digital display assemblies.

BACKGROUND OF THE INVENTION

Tree stands are commonly used to support a tree. However, conventional tree stands can be aesthetically unpleasing. For that reason, a tree skirt is often draped around a tree stand in an attempt to conceal the tree stand. However, tree skirts permit only a limited degree of customization, e.g., based on the fabric and design of the particular tree skirt.

As set forth in the present disclosure, it would be desirable to provide an annular shroud that comprises one or more display panels configured to display digital images about a perimeter of a tree stand. In some cases, it would be desirable to provide a tree stand display assembly comprising both the tree stand and the annular shroud around the tree stand. It would also be desirable to provide such an annular shroud that includes certain additional features, such as an electrical outlet, a water-proof barrier, and/or a sensor configured to indicate when an amount of water contained in the tree stand falls below a predetermined level.

SUMMARY OF THE INVENTION

In some embodiments, the invention provides a tree stand display assembly comprising a tree, a tree stand supporting the tree in an upright orientation, and an annular shroud around the tree stand. The annular shroud comprises one or more display panels configured to display digital images about a perimeter of the tree stand.

Certain other embodiments of the invention provide an annular shroud configured to be positioned around a tree stand. The annular shroud comprises one or more display panels configured to display digital images about a perimeter of the tree stand. Preferably, the annular shroud further includes one or more of an electrical outlet, a water-proof barrier, and a tree stand water level sensor.

BRIEF DESCRIPTION OF THE DRAWINGS

FIG. 3 is a top view of an annular shroud in accordance with certain embodiments of the present disclosure.

DETAILED DESCRIPTION OF PREFERRED EMBODIMENTS

Figure 1:
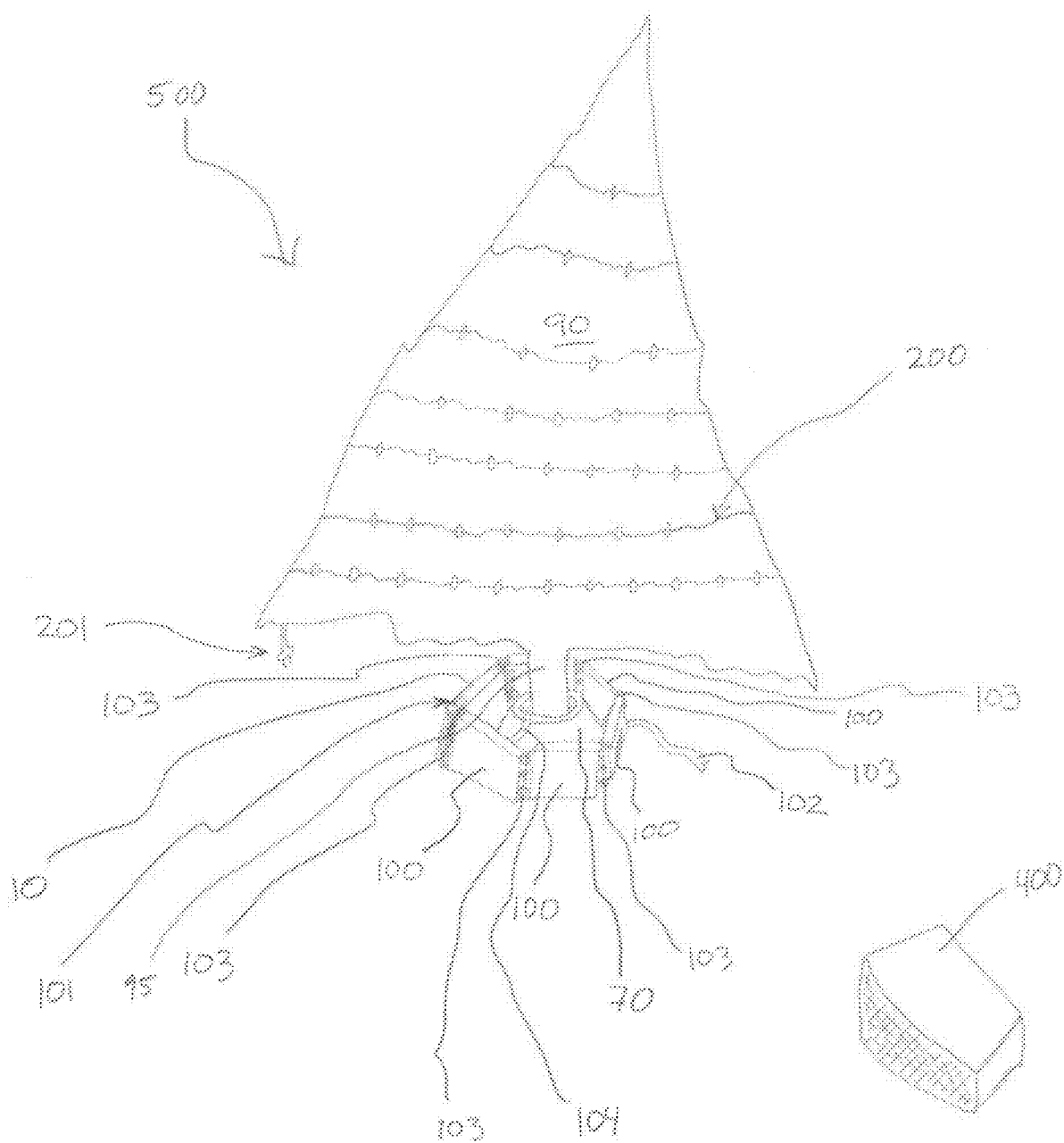
FIG. 1 is a schematic front perspective view of a tree stand display assembly in accordance with certain embodiments of the present disclosure.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Referring to the drawings, and in particular, FIG. 1, there is shown a tree stand display assembly of the present disclosure generally represented by reference numeral 500. As shown in FIG. 1, the tree stand display assembly 500 comprises both a tree 90 and a tree stand 70. As is conventional with tree stands, the tree stand 70 has an opening so as to allow a trunk 95 of the tree 90 to be placed within (e.g., received in) the opening of the tree stand 70. This arrangement allows the tree stand 70 to support (e.g., retain) the tree 90 in an upright orientation (e.g., relative to a floor or other ground surface). In some cases, the tree stand 70 has a plurality of threaded supports configured to be selectively tightened or loosened about the trunk 95 of the tree 90.

The tree 90 can be a natural tree (e.g., an evergreen tree) or an artificial tree. In some cases, the tree 90 is a holiday tree, such as a Christmas tree, and can have ornamentation provided thereon. Where the tree 90 is a natural tree, the tree stand 70 can include an internal reservoir (e.g., having an open top and a closed bottom) configured to hold fluids (e.g., water) for hydrating and/or nourishing the tree 90.

As shown in FIG. 1, the tree stand display assembly 500 further comprises an annular shroud 10 around the tree stand 70. In some embodiments, the annular shroud 10 is positioned around the tree stand 70 in a concentric arrangement. The annular shroud 10 can be in direct contact with, or spaced from, the tree stand 70. In addition, both the tree stand 70 and the annular shroud 10 can be in direct contact with a floor or other ground surface.

When assembled, the annular shroud 10 is sized and arranged so as to accommodate the size and shape of the tree stand 70. For example, in many embodiments, the annular shroud 10 is wider (e.g., has a greater diameter) than the tree stand 70 to enable the annular shroud 10 to extend around (e.g., surround) the tree stand 70. In some embodiments, the annular shroud 10 has a perimeter (e.g., circumference) of between about 24 inches and about 72 inches (e.g., between about 24 inches and about 60 inches, or between about 24 inches and about 48 inches, or between about 28 inches and about 32 inches). In addition, the annular shroud 10 preferably has a height of twenty-four inches or less (e.g., between about 6 inches and 24 inches, or between about 6 inches and about 18 inches, or between about 6 inches and about 12 inches). The height of the annular shroud 10 is not particularly limiting but is preferably taller than (or at least substantially as tall as) the tree stand 70 that it surrounds. By providing the annular shroud 10 with such a height, the annular shroud 10 preferably can be positioned to conceal a substantial portion of the tree stand 70 from view.

The annular shroud 10 comprises one or more display panels 100 configured to display digital images about a perimeter of the tree stand 70. As used herein, a digital image includes, but is not limited to, text, animations, pictures, videos, and movies, as well as any other form of electronic media capable of being displayed on a display screen. This definition includes digital images that are still, moving, and animated. Such digital images can be holiday-themed, and can include, e.g., images of Santa, elves, and/or reindeer. Preferably, the display panels(s) 100 are configured to display images that move (e.g., circumferentially about the shroud), change, or both.

The one or more display panels 100 can comprise any suitable type of display panel. In some embodiments, the one or more display panels 100 comprise one or more light emitting diode (LED) panels. In addition or alternatively, the one or more display panels 100 can comprise one or more plasma display panels (PDPs), organic light-emitting diode (OLED) display panels, liquid crystal display (LCD) panels, touch screen display panels, cathode ray tube (CRT) display panels and/or any combination thereof. Skilled artisans will appreciate that other types of display panels, not explicitly mentioned herein, can be used as the one or more display panels 100.

In certain embodiments, the one or more display panels 100 are configured to display digital images about an entire (or at least substantially the entire) circumference around the tree stand 70. This, however, is not required. For example, in some cases, the annular shroud 10 (or at least the digital panel(s)) does/do not extend about an entire circumference of the tree stand 70, e.g., leaving certain portions of the tree stand 70 exposed. In such instances, the annular shroud 10 and the tree stand 70 can be arranged such that the "exposed" portions of the tree stand 70 (i.e., those portions that are not concealed by the annular shroud 10) can face and be positioned near a wall surface.

Each display panel 100 can display a single digital image, or multiple digital images, at one time. Where multiple display panels 100 are provided, either the same image(s), or different images, can be displayed on the different display panels 100 at any given time. In some embodiments, the one or more display panels 100 are adapted to display digital images that move (e.g., rotate) about the annular shroud 10.

In any embodiment of the present disclosure, each of the one or more display panels 100 can comprise (e.g., be) a flexible or rigid display panel. Where the one or more display panels 100 are flexible display panels, such a configuration may allow the one or more display panels 100 to be rolled (e.g., for storage and/or transportation of the one or more display panels 100).

In certain embodiments, the one or more display panels 100 are a single display panel. In some embodiments of this nature, the single display panel 100 has two ends that can be connected together. In some cases, the ends of the single display panel can be locked together, or connected in some other manner.

In other embodiments, the one or more display panels 100 comprise a plurality of display panels. In such cases, the annular shroud 10 comprises a plurality of sections. The annular shroud 10 can include any number of sections, including two or more sections, or three or more sections. Each section of the annular shroud 10 includes at least one display panel 100. In some embodiments, each section of the annular shroud 10 includes two or more display panels 100 positioned in a vertical arrangement relative to other display panels of the same section. For example, each section of the annular shroud 10 can optionally include two display panels 100 arranged vertically one above the other.

In some embodiments, as shown, e.g., in FIG. 1, the annular shroud 10 includes a plurality of locks 103. In such cases, each lock 103 preferably is configured to lock together (e.g., releasably) adjacently-positioned sections of the annular shroud 10. Thus, each lock 103 may allow adjacently-positioned display panels 100 to be locked together in a releasable manner. When the shroud 10 has multiple sections, the sections may be configured to be locked together, or unlocked, as needed. For example, the sections of such an annular shroud 10 can be disassembled (e.g., unlocked) in order to facilitate transportation and/or storage.

Each of the display panels 100 has a display surface that can be either curved or generally planar. As used herein, a display surface is defined as a surface on and/or through which the one or more digital images are configured to be displayed. Where the one or more display panels 100 have a display surface that is curved, the display surface can be curved in either a concave or a convex manner.

In certain embodiments, such as the embodiment shown in FIG. 3, the annular shroud 10 comprises two semi-circular halves. In embodiments of this nature, the two semi-circular halves can be arranged (e.g., secured) together in a generally circular configuration around the tree stand 70. In some cases, the two semi-circular halves are locked together (optionally releasably) using one or more locks 103. In such instances, one or both ends of each of the two semi-circular halves can be locked to adjacently-positioned ends of the other semi-circular half. However, skilled artisans will appreciate that the two semi-circular halves do not need to be locked (or otherwise connected together) when arranged around the tree stand 70.

In any embodiment of the present disclosure, the annular shroud 10 preferably includes a power source. The power source is electrically coupled to the shroud 10 and is configured to provide (e.g., deliver) electrical power to the one or more display panels 100. In certain embodiments, as shown in FIG. 1, the power source comprises a power cord 102 extending from the annular shroud 10. When provided, the power cord 102 is configured to be plugged into an external power source (e.g., an electrical outlet). In addition or alternatively, the power source can comprise a battery (or battery pack) 700, as shown in FIG. 3.

Figure 2:
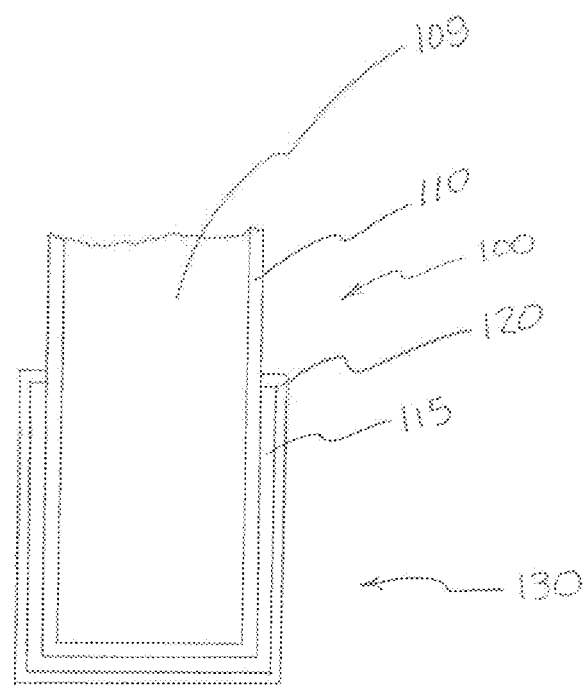
FIG. 2 is a partially broken away cross-sectional view of a display panel having a water-proof barrier in accordance with certain embodiments of the present disclosure.

In some embodiments, as shown in FIG. 2, at least a portion of the annular shroud 10 includes a water-proof barrier 130. When provided, the water-proof barrier 130 can include an inner wall 110 and an outer wall 120, and a gap 115 located between the inner wall 110 and the outer wall 120. Electronics (e.g., wiring and/or other electrical components) can be housed within an interior space 109 of the inner wall 110. This is merely one example of how the internal electronics can be protected from water. In certain embodiments, the water-proof barrier 130 is located at or near a bottom end of the annular shroud 10.

When provided, the water-proof barrier 130 comprises a water-proofing material. In some cases, the inner wall 110 and the outer wall 120 are formed entirely from the water-proofing material (e.g., plastic or metal). In other cases, the inner wall 110 and the outer wall 120 are laminated to or coated with the water-proofing material. The water-proofing material is not particularly limiting, and can be any material that is configured to resist the ingress of water (and optionally, moisture) through the water-proof barrier 130. For example, the water-proofing material can comprise rubber, polyurethane, polyvinyl chloride (PVC), silicone elastomer, or fluoropolymers. Other water-proofing materials are also contemplated and within the scope of the present disclosure.

In some embodiments, the tree stand display assembly 500 further includes a sensor 104. When provided, the sensor 104 is configured to be used with a natural tree so as to help ensure that the tree 90 remains sufficiently hydrated. In some embodiments, the sensor 104 comprises a probe (optionally attached at one end to the shroud) configured to indicate when an amount of water contained in the tree stand 70 falls below a predetermined level and/or to sense the presence of water. As shown in FIG. 1, the sensor's probe can extend into the tree stand 70 in certain embodiments. Skilled artisans will appreciate that the predetermined level will vary, depending, for example, on the size and type of tree positioned in the tree stand 70. In some cases, the predetermined level is controlled (e.g., adjustable) via a user interface (discussed below).

For embodiments involving a sensor 104, a notification may be provided to indicate when the sensor 104 detects that the water in the tree stand 70 has fallen below the predetermined level and/or when the sensor does not detect the presence of water. When the sensor is provided and so equipped, the notification can be audible and/or visual. In some cases, the notification is a visual notification (e.g., a light) provided on the one or more display panels 100 or elsewhere on the shroud. In addition or alternatively, the notification can be an audible alert played by an optional speaker 400. In some instances, the notification is an audible and/or visual alert provided on a user's mobile device (e.g., through a mobile application).

In certain embodiments, as shown in FIG. 1, the annular shroud 10 is in communication with a speaker 400. In such cases, the speaker 400 is configured to play audio, such as music or other sounds. In some embodiments, the one or more display panels 100 are adapted (and when used, are operated) to display digital images in a choreographed manner relative to music (e.g., music played by the speaker 400). As shown in FIG. 1, the speaker 400 can be a structure that is separate from the annular shroud 10. Alternatively, the speaker 400 can be integrated into the annular shroud 10 (e.g., so as to comprise a built-in speaker).

The tree stand display assembly 500 can optionally further comprise a light set 200 on the tree 90. When provided, the light set 200 can include a plurality of lights that are spaced apart from each other and electrically connected together. Such a light set 200 can include any number of lights, and the tree stand display assembly 500 can include more than one light set 200. The lights of the light set 200 can comprise any type of light having any desired size, color, and shape. In some cases, the lights of the light set 200 comprise LED lights, though other types of lights are also contemplated.

In certain embodiments, the annular shroud 10 includes an electrical outlet (or "receptacle" or "plug outlet") 101. Reference is made to FIGS. 1 and 3. When provided, the electrical outlet 101 is configured to receive an electrical plug 201 of a light set 200 when such light set is on the tree 90. Thus, in some embodiments, the shroud has an outlet 101, and an electrical plug of a light set on the tree is coupled with (e.g., plugged into) the outlet. In embodiments of this nature, electricity runs through the shroud to a light set on the tree. The annular shroud 10 can optionally include more than one electrical outlet 101. Such an arrangement allows the electrical outlets 101 to receive multiple electrical plugs, for example, from the speaker 400, multiple light sets 200 on the tree 90, and/or a mobile communication device.

Various features of the tree stand assembly 500 can be controlled by a user interface. The user interface can be provided on the annular shroud 10, on a remote control, or on a mobile application of a user's mobile device (e.g., a tablet, cell phone, or laptop). The user interface can include controls, such as a touch screen or control buttons.

The user interface can allow a user to control operation of various aspects of the tree stand display assembly 500. As non-limiting examples, the user interface may allow the user to turn on and off the tree stand display assembly 500, including the one or more display panels 100, the lights of the light set 200, and/or the speaker 400. In addition, the digital images displayed on the one or more display panels 100 may be selectable via the user interface. Through the user interface, the user may also be able to control a timer, the sensor 104, and/or audio played through the speaker 400.

In certain embodiments, the one or more display panels 100, a speaker 400, and lights of a light set 200 can be synchronized relative to each other, or can be individually controllable. For example, in some cases, each display panel 100 of the annular shroud 10 can be controlled independently relative to other display panels 100 of the annular shroud 10. Such display panels 100 can also be controlled separately from the speaker 400, when provided, and the lights of the light set 200, if desired.

In some embodiments, the tree stand display assembly 500 is selectively controllable by a timer such that the timer is configured to turn off the one or more display panels 100, a speaker 400, and/or lights of a light set 200 after a selectable period of time. When provided, the timer can be controlled directly on the annular shroud 10 or remotely (e.g., using a remote control or a mobile application on a user's mobile device). The optional timer can also be used to turn on the one or more display panels 100, a speaker 400, and/or lights of a light set 200 at a particular time.

In certain embodiments, the tree stand display assembly 500 includes a memory. In such instances, digital image and/or audio information can be stored in the memory. When provided, the memory can be configured to receive information from an external source. For example, digital image and/or audio information from a user's mobile device or the internet can be stored on an optional memory of the tree stand display assembly 500. In some cases, the memory comprises a memory card.

In some embodiments, the tree stand display assembly 500 can be controlled wirelessly and/or remotely (e.g., via a user's mobile communication device or a remote control). In some cases, the annular shroud 10 is Wi-fi-enabled and/or Bluetooth-enabled. In addition or alternatively, the annular shroud 10 can include an electronic port configured to receive an electrical cord to enable the annular shroud 10 to connect to another device, such as a smart phone, a tablet, or a computer.

Each of the one or more display panels 100 can optionally have both a regular mode and a sleep mode. In such cases, when one or more display panels 100 are in the sleep mode, a display brightness is reduced as compared to the regular mode display brightness. The user may control whether the one or more display panels 100 are in the regular mode or the sleep mode (e.g., via an optional user interface). When the one or more display panels 100 are in the sleep mode, such panel(s) 100 may display any digital image at a reduced brightness, such as a digital image of a night sky. Or, the panels may just be dark (e.g., not illuminated) when in the sleep mode.

FIG. 3 shows a top view of an embodiment of the annular shroud 10. The annular shroud 10 in FIG. 3 is configured to be positioned around a tree stand, such as the tree stand 70 shown in FIG. 1. However, if desired, it is also contemplated that the tree stand 70 can be used to hold objects other than a tree.

In other embodiments, the annular shroud 10 is connected to, or integrated into, the tree stand 70. In such cases, the one or more display panels 100 can be partially nested within the tree stand 70, or can project outwardly from the tree stand 70. In such embodiments, a single device (e.g., a single unit) has both the one or more display panels and a water reservoir configured to receive both water and a trunk of a tree.

While some preferred embodiments of the invention have been described, it should be understood that various changes, adaptations and modifications may be made therein without departing from the spirit of the invention and the scope of the appended claims.

What is claimed is:

1. A tree stand display assembly comprising a tree, a tree stand supporting the tree in an upright orientation, and an annular shroud around the tree stand, the annular shroud comprising one or more display panels configured to display digital images about a perimeter of the tree stand, the annular shroud having a greater diameter or width than the tree stand, such that the annular shroud is spaced outwardly from the tree stand, and the annular shroud having a greater height than the tree stand, so as to conceal from view a substantial portion of the tree stand, the annular shroud being configured to display the digital images about an entire circumference around the tree stand, and wherein the annular shroud further includes an electrical outlet, the electrical outlet positioned on a top wall of the annular shroud.

2. The tree stand display assembly of claim 1 wherein at least a portion of the annular shroud includes a water-proof barrier, the water-proof barrier located at a bottom end of the annular shroud, the water-proof barrier comprising a laminate or coating of water proofing material selected from the group consisting of rubber, polyurethane, polyvinyl chloride, silicone elastomer, and fluoropolymer.

3. The tree stand display assembly of claim 1 wherein the annular shroud comprises a plurality of sections and the one or more display panels comprise a plurality of display panels, each section of the annular shroud including at least one of the display panels.

4. The tree stand display assembly of claim 3 further comprising a plurality of locks, each lock being configured to releasably lock together adjacently-positioned sections of the annular shroud.

5. The tree stand display assembly of claim 3 wherein the sections of the annular shroud comprise two semi-circular halves, the two semi-circular halves being arranged together in a circular configuration around the tree stand.

6. The tree stand display assembly of claim 1 wherein the annular shroud further includes a power source, the power source being electrically coupled to the one or more display panels so as to be configured to provide electrical power to the one or more display panels.

7. The tree stand display assembly of claim 1 wherein the one or more display panels are adapted to display the digital images such that the digital images rotate about the annular shroud.

8. The tree stand assembly of claim 1 wherein the one or more display panels comprise one or more flexible display panels configured to be rolled-up for transportation or storage.

9. The tree stand display assembly of claim 1 wherein the digital images displayed on the one or more display panels are digital images selectable via a user interface.

10. The tree stand display assembly of claim 1 wherein the annular shroud is in communication with a speaker, the speaker being integrated into the annual shroud.

11. The tree stand display assembly of claim 1 wherein the one or more display panels are selectively controllable by a timer such that the timer is configured to turn off the one or more display panels after a selectable period of time.

12. The tree stand display assembly of claim 1 wherein the annular shroud is positioned around the tree stand in a concentric arrangement.

13. The tree stand display assembly of claim 1, further comprising a light set on the tree, and wherein the annular shroud has multiple electrical outlets including the electrical outlet on the top wall of the annular shroud, the electrical outlet on the top wall of the annular shroud receiving an electrical plug of the light set, and the tree stand display assembly further comprising a power cord extending from the annular shroud.

14. The tree stand display assembly of claim 1 wherein the one or more display panels are adapted to display the digital images in a choreographed manner relative to music.

15. The tree stand display assembly of claim 1 wherein the annular shroud is Wi-fi-enabled or Bluetooth-enabled.

16. A tree stand display assembly comprising a tree, a tree stand supporting the tree in an upright orientation, and an annular shroud around the tree stand, the annular shroud comprising one or more display panels configured to display digital images about a perimeter of the tree stand, the annular shroud having a greater diameter or width than the tree stand, such that the annular shroud is spaced outwardly from the tree stand, and the annular shroud having a greater height than the tree stand, so as to conceal from view a substantial portion of the tree stand, wherein the annular shroud does not extend about an entire circumference of the tree stand, but rather leaves a circumferential portion of the tree stand exposed, the annular shroud and the tree stand positioned such that said exposed circumferential portion of the tree stand faces and is adjacent to a wall surface.

17. A tree stand display assembly comprising a tree, a tree stand supporting the tree in an upright orientation, and an annular shroud around the tree stand, the annular shroud comprising one or more display panels configured to display digital images about a perimeter of the tree stand, the annular shroud having a greater diameter or width than the tree stand, such that the annular shroud is spaced outwardly from the tree stand, and the annular shroud having a greater height than the tree stand, so as to conceal from view a substantial portion of the tree stand, and further including a sensor, the sensor comprising a probe configured to extend into the tree stand to indicate when an amount of water contained in the tree stand falls below a predetermined level, the probe connected at one end to the annular shroud.

18. An annular shroud configured to be positioned around a tree stand such that the annular shroud is spaced outwardly from the tree stand and has a greater height than the tree stand so as to conceal from view a substantial portion of the tree stand, the annular shroud comprising one or more display panels configured to display digital images about a perimeter of the tree stand, the annular shroud configured to display the digital images about an entire circumference around the tree stand, wherein the annular shroud further includes an electrical outlet, the electrical outlet positioned on a top wall of the annular shroud, the annular shroud having multiple electrical outlets including the electrical outlet on the top wall of the annular shroud.

19. The annular shroud of claim 18 wherein at least a portion of the annular shroud includes a water-proof barrier, the water-proof barrier located at a bottom end of the annular shroud, the water-proof barrier comprising an outer wall and an inner wall, the annular shroud including electrical components housed within an interior space of the inner wall.

20. The annular shroud of claim 19 wherein each of the one or more display panels has both a regular mode and a sleep mode, wherein when the one or more display panels is in the sleep mode, a brightness of the one or more display panels is reduced as compared to when the one or more display panels is in the regular mode.

* * * * *